(12) United States Patent
Toriumi et al.

(10) Patent No.: US 11,652,443 B2
(45) Date of Patent: May 16, 2023

(54) CIRCUIT DEVICE AND OSCILLATOR

(71) Applicant: Seiko Epson Corporation, Tokyo (JP)

(72) Inventors: Yuichi Toriumi, Minowa (JP); Hideo Haneda, Shiojiri (JP); Teppei Higuchi, Chino (JP); Atsushi Tanaka, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/587,127

(22) Filed: Jan. 28, 2022

(65) Prior Publication Data

US 2022/0247352 A1    Aug. 4, 2022

(30) Foreign Application Priority Data

Jan. 29, 2021   (JP) .............................. JP2021-012770

(51) Int. Cl.
*H03B 5/04*   (2006.01)
*H03B 5/32*   (2006.01)

(52) U.S. Cl.
CPC ................ *H03B 5/04* (2013.01); *H03B 5/32* (2013.01); *H03B 2200/005* (2013.01); *H03B 2201/025* (2013.01); *H03B 2201/0208* (2013.01)

(58) Field of Classification Search
CPC ....................................................... H03B 5/04
USPC ......................................................... 331/158
See application file for complete search history.

(56) References Cited

U.S. PATENT DOCUMENTS

| 7,046,098 | B2* | 5/2006 | Staszewski | ........... | H03L 7/0991 |
| | | | | | 331/34 |
| 2012/0063504 | A1* | 3/2012 | Simmons | ............... | H03K 3/017 |
| | | | | | 331/8 |
| 2021/0265999 | A1* | 8/2021 | Degani | ................... | H03L 7/081 |

FOREIGN PATENT DOCUMENTS

JP    H05-218738 A    8/1993

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit and a processing circuit that generates capacitance control data. The oscillation circuit includes a variable capacitance circuit whose capacitance value is variably controlled based on the capacitance control data, and an oscillation frequency thereof is controlled based on the capacitance value of the variable capacitance circuit. The variable capacitance circuit includes a capacitor array. The capacitor array includes a plurality of capacitors each having a binary-weighted capacitance value, and a plurality of switches that are on-off controlled based on the capacitance control data. The processing circuit outputs the capacitance control data, which is subjected to dithering, so as to switch the capacitance value of the variable capacitance circuit between a first capacitance value and a second capacitance value in a time division manner.

8 Claims, 15 Drawing Sheets

FIG. 14

| [GL'[2:0] | TDP[31:0] | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 000h | 0 | | | | | | | | | | | | | | | | | | | | | | | | | | | | | | | |
| 001h | | | | | | | | | | | | | | | | | | | | | | | | | | | | | | | | 1 |
| 010h | | | | | | | | 0 | | | | | | | 1 | | | | | | | | 0 | | | | | | | 1 | |
| 011h | | | | 0 | | | 1 | | | | 0 | | | 1 | | | | | 0 | | | 1 | | | | 0 | | | 1 | | | |
| 100h | | | 0 | | 1 | 1 | | | | 0 | | 1 | 1 | | | | | 0 | | 1 | 1 | | | | 0 | | 1 | 1 | | | | |
| 101h | | 0 | 1 | 1 | 0 | 0 | 1 | 1 | | 0 | 1 | 0 | 0 | 1 | 1 | | | 0 | 1 | 0 | 0 | 1 | 1 | | 0 | 1 | 0 | 0 | 1 | 1 | | |
| 110h | 0 | 1 | 0 | 0 | 1 | 1 | 0 | 0 | 0 | 1 | 0 | 0 | 1 | 1 | 0 | 0 | 0 | 1 | 0 | 0 | 1 | 1 | 0 | 0 | 1 | 0 | 0 | 1 | 1 | 0 | 0 | |
| 111h | 0 | 0 | 0 | 1 | 1 | 0 | 0 | 1 | 0 | 0 | 1 | 1 | 0 | 0 | 1 | 0 | 0 | 0 | 1 | 1 | 0 | 0 | 1 | 0 | 0 | 1 | 1 | 0 | 0 | 1 | 0 | |

72

CIRCUIT DEVICE AND OSCILLATOR

The present application is based on, and claims priority from JP Application Serial Number 2021-012770, filed Jan. 29, 2021, the disclosure of which is hereby incorporated by reference herein in its entirety.

BACKGROUND

1. Technical Field

The present disclosure relates to a circuit device and an oscillator.

2. Related Art

There is known a temperature compensation oscillator in which a capacitor array is coupled to an oscillation node of an oscillation circuit and temperature compensation for an oscillation frequency is performed by controlling a capacitance value of the capacitor array according to a temperature. A digital temperature compensation oscillator disclosed in JP-A-5-218738 includes, in order to perform precise control by using a small number of capacitance elements, a plurality of first capacitance elements having the same capacitance value and a second capacitance element having a capacitance value of $1/(n+1)$ with respect to the capacitance value of the first capacitance elements. A capacitor array is constituted by the plurality of first capacitance elements and the second capacitance element, and the digital temperature compensation oscillator temperature-compensates an oscillation frequency by controlling a capacitance value of the capacitor array according to a temperature.

In temperature compensation using the capacitor array, the linearity of the capacitance value of the capacitor array influences the compensation accuracy of the temperature compensation. It is conceivable to use, as the capacitor array, a configuration in which a capacitance value of each capacitor is binary-weighted. For example, a capacitance value corresponding to an LSB is C and the capacitor array includes capacitors having C, 2C, 4C and 8C. In this case, there is a problem that, for example, when switching between a state where C+2C+4C=7C is selected and a state where 8C is selected, or, when switching between a state where C+2C=3C is selected and a state where 4C is selected, the linearity of the capacitance value tends to be decreased due to an influence of parasitic capacitance or manufacturing variation.

SUMMARY

One aspect of the present disclosure relates to a circuit device including: a processing circuit that generates capacitance control data; and an oscillation circuit that includes a variable capacitance circuit whose capacitance value is variably controlled based on the capacitance control data, and whose oscillation frequency is controlled based on the capacitance value of the variable capacitance circuit, in which the variable capacitance circuit includes a capacitor array, the capacitor array includes a plurality of capacitors each having a binary-weighted capacitance value, and a plurality of switches that are provided in series with the plurality of capacitors between an oscillation node and a ground node of the oscillation circuit and that are on-off controlled based on the capacitance control data, and the processing circuit outputs the capacitance control data, which is subjected to dithering, so as to switch the capacitance value of the variable capacitance circuit between a first capacitance value and a second capacitance value in a time division manner.

In addition, another aspect of the present disclosure relates to an oscillator including the circuit device described above and a resonator that oscillates by being driven by the oscillation circuit.

BRIEF DESCRIPTION OF THE DRAWINGS

FIG. 14 shows an example of a second table stored in a time division pattern storage unit.

DESCRIPTION OF EXEMPLARY EMBODIMENTS

Hereinafter, a preferred embodiment of the present disclosure will be described in detail. The present embodiment to be described below does not unduly limit contents described in the claims, and all configurations described in the present embodiment are not necessarily essential constituent elements.

1. Circuit Device

Figure 1:
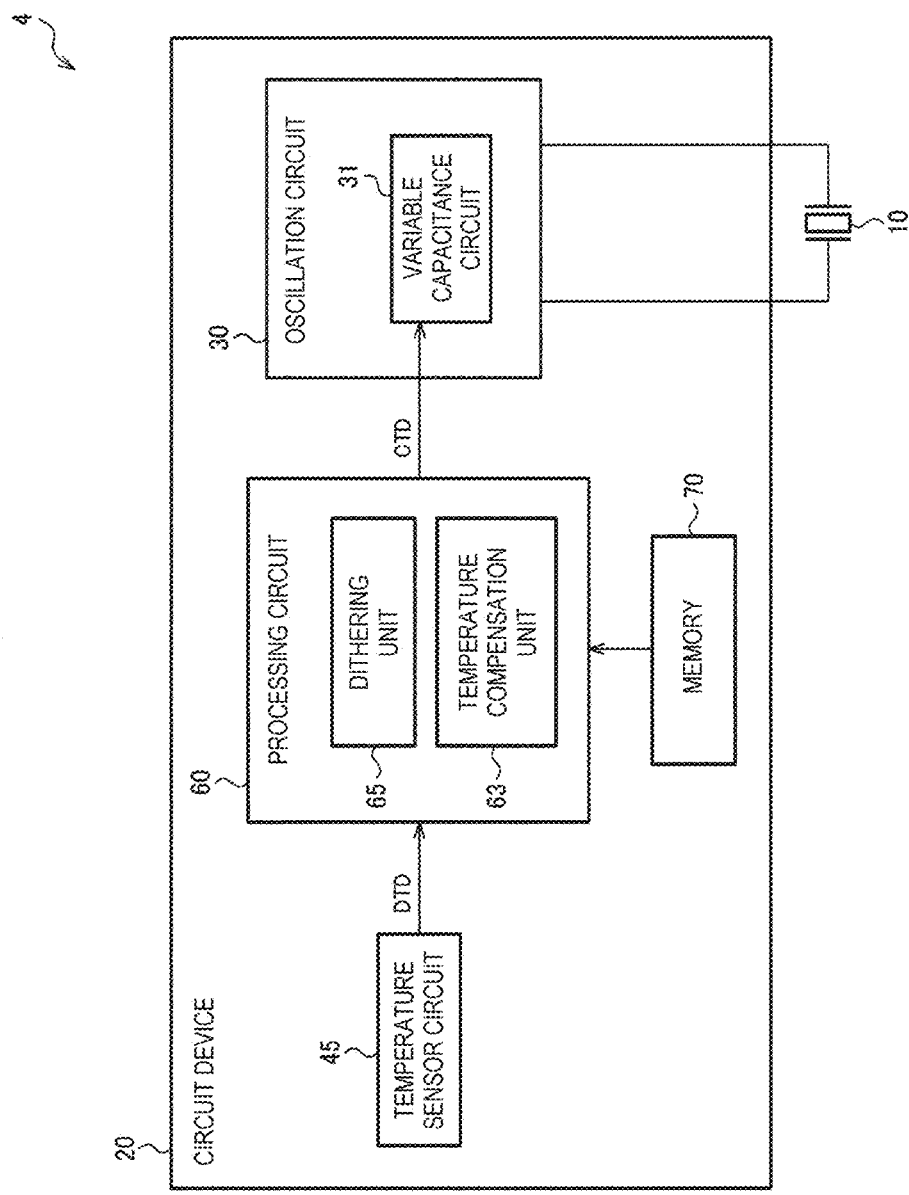
FIG. 1 shows a configuration example of a circuit device and an oscillator.

FIG. 1 shows a configuration example of a circuit device 20 and an oscillator 4. The oscillator 4 includes the circuit device 20 and a resonator 10.

The circuit device 20 is an integrated circuit device called an integrated circuit (IC). For example, the circuit device 20 is an IC manufactured by a semiconductor process, and is a semiconductor chip in which a circuit element is formed on a semiconductor substrate. The circuit device 20 includes an oscillation circuit 30, a temperature sensor circuit 45, a processing circuit 60, and a memory 70. The temperature sensor circuit 45 may be provided outside the circuit device 20. In this case, temperature detection data is input to the circuit device 20 from the outside.

The temperature sensor circuit 45 detects a temperature and outputs temperature detection data DTD indicating a result of the temperature detection. The temperature detection data DTD is data that monotonically increases or monotonically decreases with respect to the temperature. The temperature sensor circuit 45 includes, for example, a temperature sensor and an A/D conversion circuit. The temperature sensor outputs, by using temperature dependence of a forward voltage of a PN junction, a temperature detection voltage whose voltage value changes according to the temperature. The A/D conversion circuit A/D-converts the temperature detection voltage and outputs a result of the A/D conversion as the temperature detection data DTD. Alternatively, the temperature sensor circuit 45 includes a ring oscillator and a counter. An oscillation frequency of the ring oscillator has temperature dependence. The counter counts an output pulse signal, which is an oscillation signal of the ring oscillator, in a counting period defined by a clock signal based on an oscillation signal of the oscillation circuit 30, and outputs a count value as the temperature detection data DTD.

The oscillation circuit 30 includes a variable capacitance circuit 31 constituted by a capacitor array, and oscillates at an oscillation frequency corresponding to a capacitance value of the variable capacitance circuit 31. The oscillation frequency is temperature-compensated by controlling the capacitance value of the variable capacitance circuit 31 such that the oscillation frequency is constant with respect to a temperature fluctuation. The oscillation circuit 30 oscillates the resonator 10 electrically coupled to the oscillation circuit 30. Specifically, the circuit device 20 includes a first terminal and a second terminal, and one end of the resonator 10 is coupled to the oscillation circuit 30 via the first terminal and the other end of the resonator 10 is coupled to the oscillation circuit 30 via the second terminal. As the oscillation circuit 30, various types of oscillation circuits such as Pearson type, Colpitts type, inverter type or Hartley type can be used.

The resonator 10 is an element that generates mechanical oscillation by an electrical signal. The resonator 10 can be implemented by a resonator element such as a crystal resonator element. For example, the resonator 10 is a tuning fork type crystal resonator element. Alternatively, the resonator 10 can be implemented by a thickness-shear vibration type crystal resonator element or the like that has a cut angle of AT cut, SC cut, or the like. The resonator 10 of the present embodiment can be implemented by various resonator elements such as a resonator element other than a tuning fork type or thickness-shear vibration type resonator element, or a piezoelectric resonator element made of a material other than quartz crystal. For example, a SAW resonator or a MEMS resonator as a silicon resonator formed by using a silicon substrate may be adopted as the resonator 10. SAW is an abbreviation for surface acoustic wave, and MEMS is an abbreviation for micro electro mechanical systems.

The processing circuit 60 performs capacitance control for the variable capacitance circuit 31 based on the temperature detection data DTD. The processing circuit 60 includes a temperature compensation unit 63 and a dithering unit 65. The temperature compensation unit 63 performs temperature compensation based on the temperature detection data DTD and information stored in the memory 70, and outputs a result of the temperature compensation as temperature-compensated capacitance control data. The temperature-compensated capacitance control data is input as input capacitance control data to the dithering unit 65. The dithering unit 65 performs dithering on the input capacitance control data, and outputs a result of the dithering as the dithered capacitance control data. The processing circuit 60 may output the dithered capacitance control data as the capacitance control data CTD, or may output, as the capacitance control data CTD, the dithered capacitance control data which is subjected to a further process. The capacitance value of the variable capacitance circuit 31 is set to a capacitance value indicated by the capacitance control data CTD.

The processing circuit 60 is a logic circuit constituted by a logic element such as an AND circuit, an OR circuit, an inverter, and a latch circuit. Each of the temperature compensation unit 63 and the dithering unit 65 may be constituted by an individual logic circuit. Alternatively, processes of the temperature compensation unit 63 and the dithering unit 65 may be executed by a DSP. The DSP is an abbreviation for digital signal processor. In this case, a function of each of these units is implemented by the DSP executing a program that describes functions of the temperature compensation unit 63 and the dithering unit 65.

The memory 70 stores information to be used when the processing circuit 60 generates the capacitance control data CTD based on the temperature detection data DTD. The information stored in the memory 70 includes a lookup table in which the temperature detection data DTD and a capacitance adjustment value are associated with each other. The processing circuit 60 acquires the capacitance adjustment value corresponding to the temperature detection data DTD from the lookup table, and outputs the temperature-compensated capacitance control data by performing a process such as linear interpolation on the capacitance adjustment value. The memory 70 is, for example, a non-volatile memory. In this case, the above-described information is written into the non-volatile memory at the time of manufacturing the oscillator 4. The non-volatile memory may be, for example, an electrically erasable programmable read only memory (EEPROM), a flash memory, or a fuse memory. Alternatively, the memory 70 may be a random access memory (RAM) or a register. In this case, the above-described information is written into the RAM or the register from an external host device or the like.

Coupling in the present embodiment is electrical coupling. The electrical coupling means coupling with which electrical signals can be transmitted, and coupling with which information can be transmitted by the electric signals. The electrical coupling may be coupling via a passive element, an active element, or the like.

Figure 2:
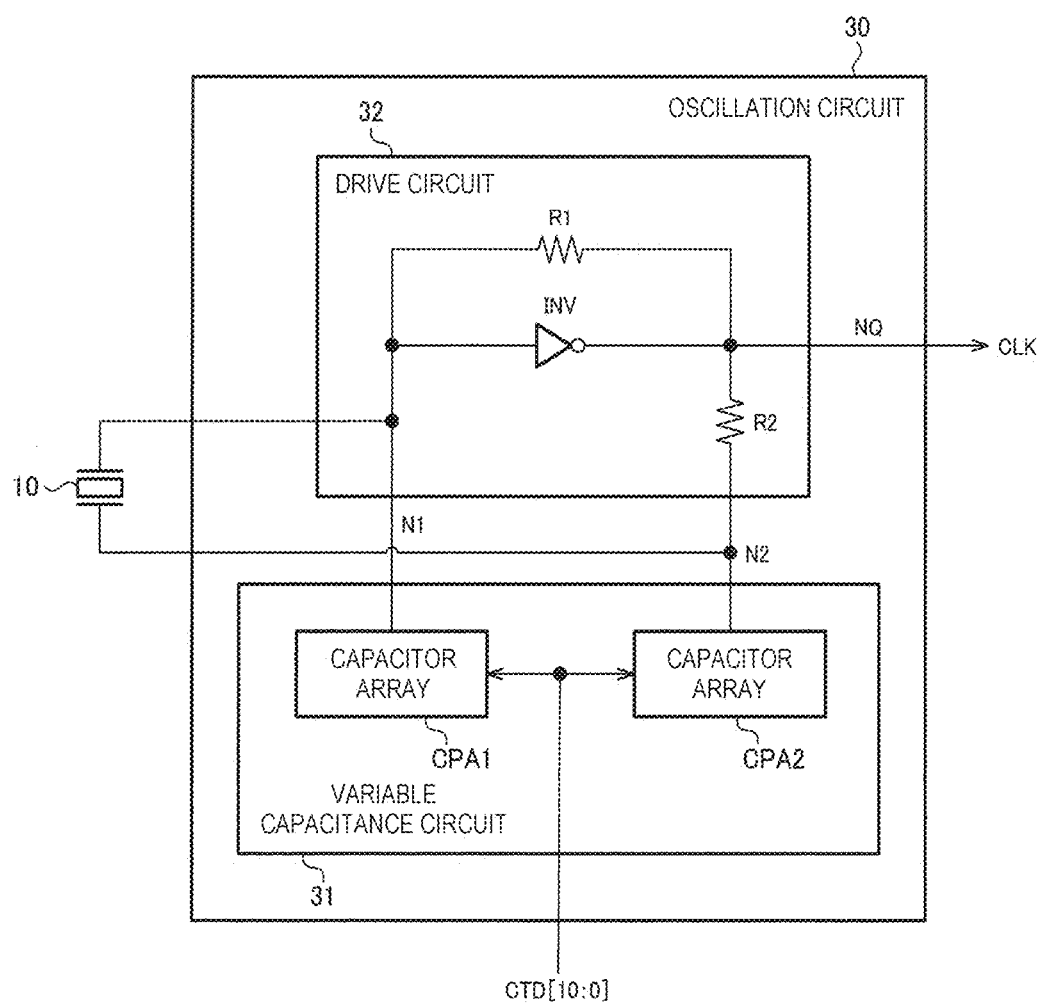
FIG. 2 shows a detailed configuration example of an oscillation circuit and a variable capacitance circuit.

FIG. 2 shows a detailed configuration example of the oscillation circuit 30 and the variable capacitance circuit 31. The oscillation circuit 30 includes the variable capacitance circuit 31 and a drive circuit 32. Here, although the number of bits of the capacitance control data CTD is 11, it is sufficient that the number of bits of the capacitance control data CTD is, for example, 3 or more.

The drive circuit 32 oscillates the resonator 10 by driving the resonator 10, and outputs, to a node NQ, a clock signal CLK obtained by the oscillation. The node NQ is an output node of the oscillation circuit 30. An input node N1 of the drive circuit 32 is coupled to one end of the resonator 10, and an output node N2 of the drive circuit 32 is coupled to the other end of the resonator 10.

The drive circuit 32 includes an inverter INV and resistors R1 and R2. An input node of the inverter INV and one end of the resistor R1 are coupled to the input node N1 of the drive circuit 32. An output node of the inverter INV and the other end of the resistor R1 are coupled to the node NQ. One end of the resistor R2 is coupled to the node NQ, and the other end of the resistor R2 is coupled to the output node N2 of the drive circuit 32.

The variable capacitance circuit 31 is coupled to the input node N1 and the output node N2 of the drive circuit 32. By changing the capacitance value of the variable capacitance circuit 31 based on capacitance control data CTD [10:0], a load of the drive circuit 32 changes and the oscillation frequency of the oscillation circuit 30 changes. Accordingly, temperature compensation of the oscillation frequency is realized. The variable capacitance circuit 31 includes a capacitor array CPA1 coupled to the input node N1 of the drive circuit 32 and a capacitor array CPA2 coupled to the output node N2 of the drive circuit 32. The capacitor arrays CPA1 and CPA2 are set to the same capacitance value by the capacitance control data CTD [10:0]. Only one of the capacitor arrays CPA1 and CPA2 may be provided.

A node in an oscillation loop of the oscillation circuit 30 to which a capacitor array is coupled is also called an oscillation node. In FIG. 2, the input node N1 or the output node N2 is an oscillation node.

Figure 3:
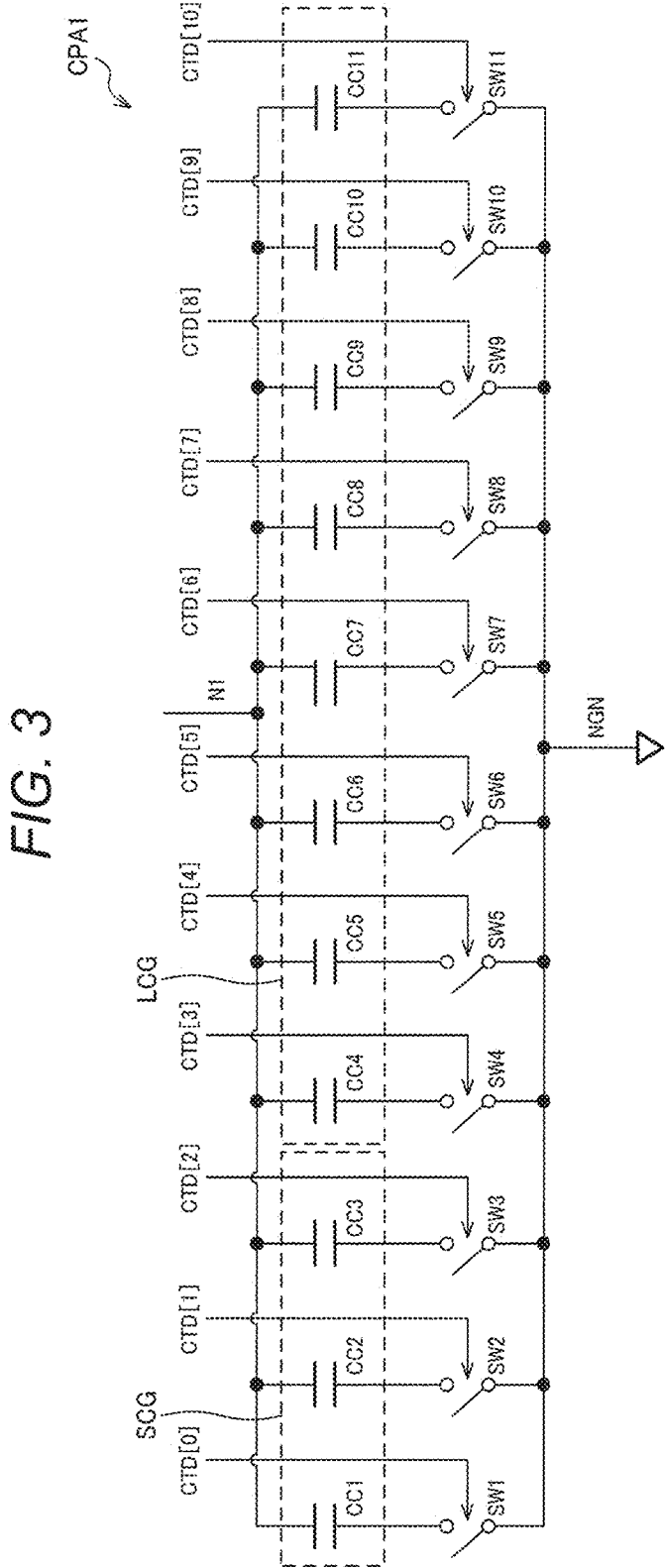
FIG. 3 shows a first detailed configuration example of a capacitor array.

FIG. 3 shows a first detailed configuration example of the capacitor array CPA1. Since the capacitor array CPA2 also has the same configuration, the capacitor array CPA1 will be described here as an example.

The capacitor array CPA1 includes capacitors CC1 to CC11 and switches SW1 to SW11. The number of capacitors and the number of switches are not limited to 11, and it is sufficient that the capacitor array CPA1 includes first to nth capacitors and first to nth switches. n is an integer of 2 or more, and is, for example, the number of bits of the capacitance control data CTD.

One end of the capacitor CC1 is coupled to the input node N1 of the drive circuit 32 and the other end of the capacitor CC1 is coupled to one end of the switch SW1, and the other end of the switch SW1 is coupled to a ground node NGN. Similarly, one end of the capacitors CC2 to CC11 is coupled to the input node N1 and the other end of the capacitors CC2 to CC11 is respectively coupled to one end of the switches SW2 to SW11, and the other end of the switches SW2 to SW11 is coupled to the ground node NGN.

The switches SW1 to SW11 are, for example, transistors. The switch SW1 is controlled to be turned on or off by using a first bit CTD [0] of the capacitance control data CTD [10:0]. Similarly, the switches SW2 to SW11 are respectively controlled to be turned on or off by using second to eleventh bits CTD [1] to CTD [11] of the capacitance control data CTD [10:0].

Capacitance values of the capacitors CC1 to CC11 are binary-weighted. That is, when s is an integer of 1 or more and 11 or less, a capacitance value of a capacitor CCs is $2^{s-1}$ times the capacitance value of the capacitor CC1. An example in which the capacitors CC1 to CC11 are configured by combining series coupling and parallel coupling of unit capacitors will be described below. However, the present disclosure is not limited to this example, and the capacitor CC1 may be constituted by one unit capacitor and the capacitor CCs may be constituted by $2^{s-1}$ unit capacitor.

As shown in FIG. 3, the capacitors CC4 to CC11 constitute a first capacitor group LCG corresponding to high-order side bit CTD [10:3] of the capacitance control data CTD [10:0]. The capacitors CC1 to CC3 constitute a second capacitor group SCG corresponding to a low-order side bit CTD [2:0] of the capacitance control data CTD [10:0]. Each capacitor of the first capacitor group LCG is constituted by a plurality of unit capacitors coupled in parallel, and each capacitor of the second capacitor group SCG is constituted by a plurality of unit capacitors coupled in series. Each unit capacitor is, for example, an MIM capacitor. The MIM is an abbreviation for metal insulator metal. It is sufficient that the first capacitor group LCG includes one or more capacitors, and it is sufficient that the second capacitor group SCG includes one or more capacitors.

Figure 4:
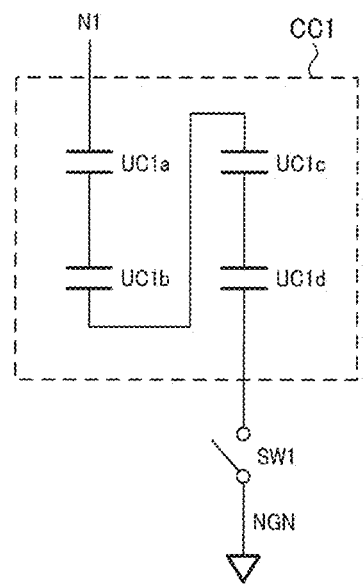
FIG. 4 shows a detailed configuration example of a capacitor.

FIG. 4 shows a detailed configuration example of the capacitor CC1. The capacitor CC1 includes unit capacitors UC1a to UC1d coupled in series between the input node N1 and one end of the switch SW1. When a capacitance value of the unit capacitor is 4C, the capacitance value of the capacitor CC1 is 4C/4=C. For example, the unit capacitors UC1a and UC1b are two MIM capacitors stacked in a thickness direction of the semiconductor substrate, and the unit capacitors UC1c and UC1d are two MIM capacitors stacked in the thickness direction of the semiconductor substrate.

Figure 5:
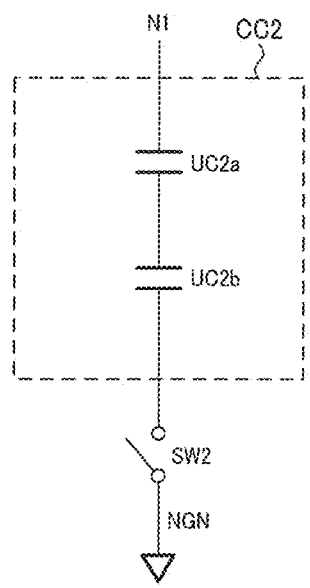
FIG. 5 shows a detailed configuration example of a capacitor.

FIG. 5 shows a detailed configuration example of the capacitor CC2. The capacitor CC2 includes unit capacitors UC2a and UC2b coupled in series between the input node N1 and one end of the switch SW1. A capacitance value of the capacitor CC2 is 4C/2=2C. For example, the unit capacitors UC2a and UC2b are two MIM capacitors stacked in the thickness direction of the semiconductor substrate.

Figure 6:
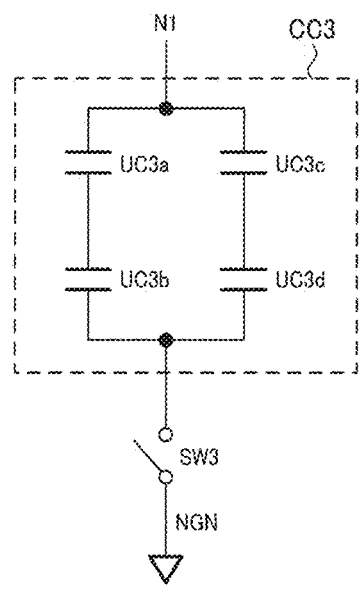
FIG. 6 shows a detailed configuration example of a capacitor.

FIG. 6 shows a detailed configuration example of the capacitor CC3. The capacitor CC3 includes unit capacitors UC3a and UC3b coupled in series between the input node N1 and one end of the switch SW1, and unit capacitors UC3c and UC3d coupled in series between the input node N1 and one end of the switch SW1. A capacitance value of the capacitor CC3 is (4C/2)×2=4C. For example, the unit capacitors UC3a and UC3b are two MIM capacitors stacked in the thickness direction of the semiconductor substrate, and the unit capacitors UC3c and UC3d are two MIM capacitors stacked in the thickness direction of the semiconductor substrate.

Figure 7:
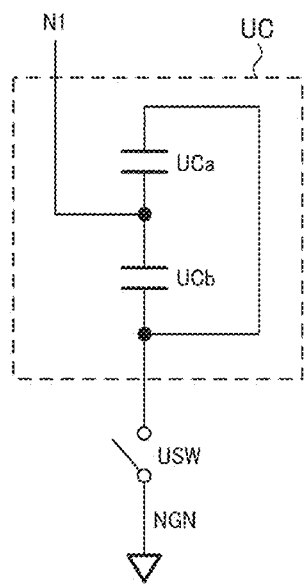
FIG. 7 shows a configuration example of a basic capacitor constituting capacitors and a basic switch constituting switches.

FIG. 7 shows a configuration example of a basic capacitor UC constituting the capacitors CC4 to CC11 and a basic switch USW constituting the switches SW4 to SW11. The basic capacitor UC includes unit capacitors UCa and UCb coupled in parallel between the input node N1 and one end of the basic switch USW. The other end of the basic switch USW is coupled to the ground node NGN. A capacitance value of the basic capacitor UC is 4C×2=8C. For example, the unit capacitors UCa and UCb are two MIM capacitors stacked in the thickness direction of the semiconductor substrate. The basic switch USW is a transistor.

The basic capacitor UC and the basic switch USW shown in FIG. 7 are collectively called a basic unit. The capacitor CC4 and the switch SW4 are constituted by one basic unit. The capacitor CC5 and the switch SW5 are constituted by two basic units coupled in parallel. The capacitor CC6 and the switch SW6 are constituted by four basic units coupled in parallel. The number of basic units coupled in parallel increases in powers of 2 thereafter. Here, although an example in which each of the switches SW4 to SW11 is constituted by one or a plurality of basic switches is described, each of the switches SW4 to SW11 may be constituted by one transistor.

Figure 8:
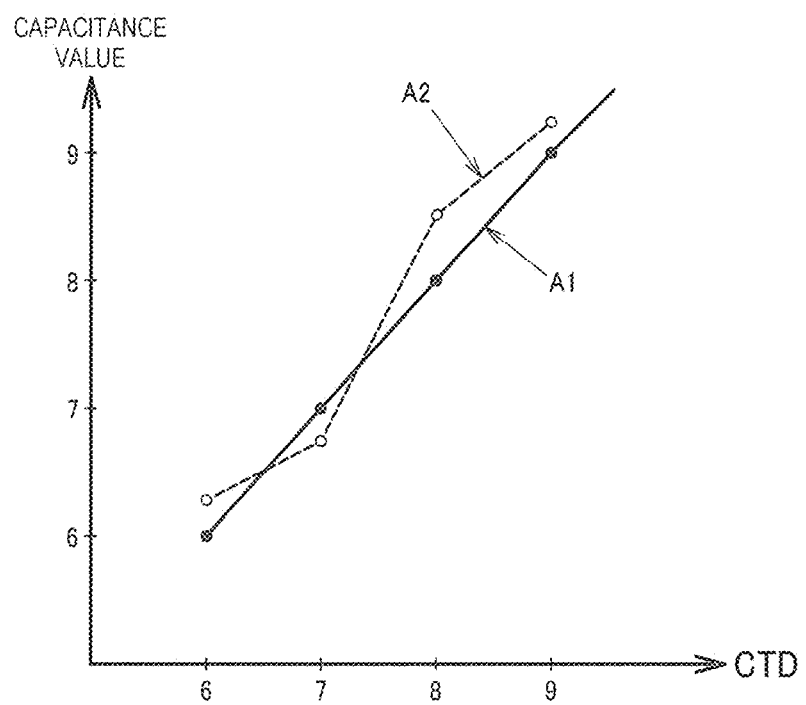
FIG. 8 shows a capacitance value of the variable capacitance circuit with respect to capacitance control data when a dithering unit does not perform dithering.

FIG. 8 shows a capacitance value of the variable capacitance circuit 31 with respect to the capacitance control data CTD when the dithering unit 65 does not perform dithering. The capacitance value of the capacitor CC1 is 1C, and the capacitance value on a vertical axis is expressed in a unit of 1C. The CTD on a horizontal axis is expressed in a decimal number.

A1 shows an ideal value when there is no error in the capacitance value, and the capacitance value=CTD. A2 is a capacitance value with respect to the capacitance control data CTD when an error in the capacitance value is taken into consideration. When CTD=7, the capacitors CC1 to CC3, in which unit capacitors are coupled in series, are used, and when CTD=8, the capacitor CC4, in which the unit capacitors are coupled in parallel, is used. Since a method of imparting a parasitic capacitance changes depending on whether the unit capacitors are coupled in series or coupled in parallel, the error in the capacitance value also greatly differs. Therefore, in the case of switching between CTD=7 and CTD=8, the linearity of the capacitance value is greatly decreased. Since the linearity of the capacitance value of the variable capacitance circuit 31 influences the compensation accuracy of temperature compensation for the oscillation frequency, a deviation of the oscillation frequency tends to be increased when the linearity is decreased.

The dithering of the present embodiment that can reduce such a decrease in linearity will be described below. Here, although the decrease in linearity in the case of switching between series coupling and parallel coupling is described as an example, the dithering of the present embodiment can also be applied to other decreases in linearity. For example, the linearity of the capacitance value tends to be decreased when a digit of a bit is carried up or down such as CTD=0111 and 1000 when the CTD is expressed in a binary number. The dithering of the present embodiment is also effective for such a decrease in linearity.

Figure 9:
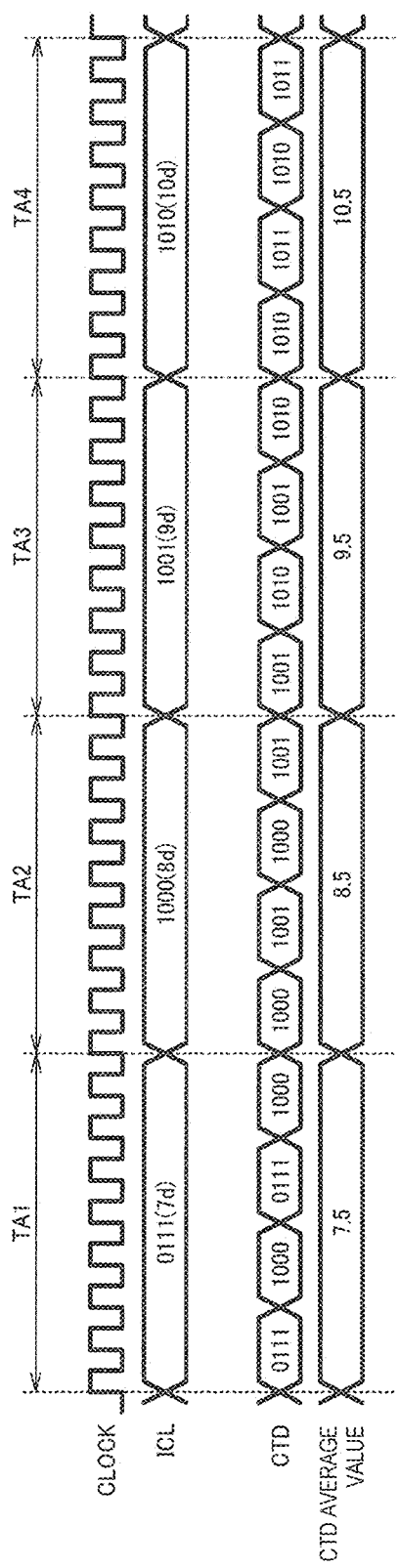
FIG. 9 is a timing chart illustrating an operation of a processing circuit.

FIG. 9 is a timing chart illustrating an operation of the processing circuit 60. Here, an example in which an output of the dithering unit 65 is the capacitance control data CTD is described, but for example, as in a second detailed configuration example of the processing circuit 60 described later, the output of the dithering unit 65 may be further processed and then output as the capacitance control data CTD.

The temperature compensation unit 63 outputs temperature-compensated capacitance control data ICL at a predetermined interval, and the temperature-compensated capacitance control data ICL is input as the input capacitance control data to the dithering unit 65. Here, the ICL and the CTD are 4-bits. TA1 to TA4 indicate periods at a predetermined interval, and in an example of FIG. 9, the temperature compensation unit 63 outputs ICL=0111, 1000, 1001, and 1010 during the TA1, the TA2, the TA3, and the TA4.

The dithering unit 65 alternately outputs CTD=ICL and CTD=ICL+1 by performing the dithering on the input ICL. Specifically, when CTD=ICL and CTD=ICL+1 are set as one set, the dithering unit 65 repeats one or a plurality of sets in each period of the periods TA1 to TA4. FIG. 9 shows an example in which two sets are repeated in each period. For example, in the period TA1, the dithering unit 65 outputs CTD=0111, 1000, 0111, and 1000 in a time division manner. A time averaged value of the CTD in the period TA1 is (7+8)/2=7.5. Similarly, the dithering unit 65 outputs CTD respectively having a time averaged value of CTD=8.5, 9.5, and 10.5 by performing the dithering on the input ICL=8, 9, and 10 in the periods TA2, TA3, and TA4.

FIG. 9 illustrates an example in which the temperature-compensated capacitance control data ICL is different in the periods TA1 to TA4, but an interval between the TA1 to TA4 means a data sampling cycle, and actually, temperature-compensated capacitance control data ICL may be different or may be the same in adjacent periods.

Figure 10:
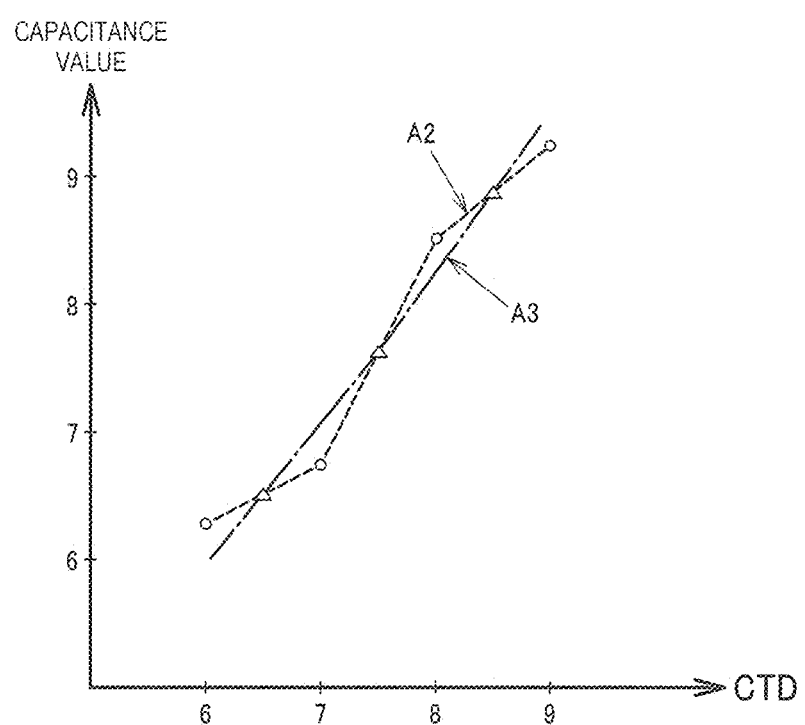
FIG. 10 shows a capacitance value of the variable capacitance circuit with respect to the capacitance control data when dithering of the present embodiment is applied.

A3 in FIG. 10 shows a capacitance value of the variable capacitance circuit 31 with respect to the capacitance control data CTD when the dithering of the present embodiment is applied to A2 in FIG. 8.

Since when ICL=7, the dithering unit 65 outputs CTD=7 and 8 in a time division manner, the capacitance value of the variable capacitance circuit 31 is a time averaged value of a capacitance value corresponding to CTD=7 and a capacitance value corresponding to CTD=8. In FIG. 10, the capacitance value of the variable capacitance circuit 31 is indicated by a triangular mark corresponding to CTD=7.5. Similarly, when ICL=8, the capacitance value of the variable capacitance circuit 31 is a time averaged value of the capacitance value corresponding to CTD=8 and a capacitance value corresponding to CTD=9. Although the error in the capacitance value is large in the case of switching between CTD=7 and 8, the linearity of the capacitance value with respect to the CTD is improved by distributing the error by the above-described dithering. By improving the linearity, the compensation accuracy of the temperature compensation of the oscillation frequency is improved, and the deviation of the oscillation frequency can be reduced.

In the present embodiment described above, the circuit device 20 includes the oscillation circuit 30 and the processing circuit 60 that generates the capacitance control data CTD. The oscillation circuit 30 includes the variable capacitance circuit 31 whose capacitance value is variably controlled based on the capacitance control data CTD, and an oscillation frequency thereof is controlled based on the capacitance value of the variable capacitance circuit 31. The variable capacitance circuit 31 includes the capacitor array CPA1. The capacitor array CPA1 includes a plurality of switches SW1 to SW11 and a plurality of capacitors CC1 to CC11 each having a binary-weighted capacitance value. The plurality of switches SW1 to SW11 are provided in series with the plurality of capacitors CC1 to CC11 between the oscillation node and the ground node NGN of the oscillation circuit 30, and are on-off controlled based on the capacitance control data CTD. The processing circuit 60 outputs the capacitance control data CTD, which is subjected to dithering, so as to switch the capacitance value of the variable capacitance circuit 31 between a first capacitance value and a second capacitance value in a time division manner.

In the period TA1 in FIG. 9, a capacitance value corresponding to CTD=0111 is the first capacitance value, and a capacitance value corresponding to CTD=1000 is the second capacitance value. Alternatively, in a second detailed configuration example described later in FIG. 15, time division is further performed in a subsequent stage of the dithering, and a capacitance value realized as a time averaged value of the time division is the first capacitance value or the second capacitance value. In the period TB1 in FIG. 15, dithered capacitance control data ICL' [13:0] includes an integer part ICL' [13:3]=CLQ and a fractional part ICL' [2:0], and the fractional part ICL' [2:0] is time division between 010 and 011 by the dithering. By time division control of a capacitor array with respect to this ICL' [2:0]=010, 011, a first capacitance value CLQ+2/8 and a second capacitance value CLQ+3/8 are realized as time averaged values.

According to the present embodiment, by performing the dithering to switch the capacitance value of the variable capacitance circuit 31 between the first capacitance value and the second capacitance value in a time division manner, the capacitance value of the variable capacitance circuit 31 is an average value of the first capacitance value and the second capacitance value in time average. Accordingly, the linearity of the capacitance value of the variable capacitance circuit 31 with respect to the capacitance control data CTD can be improved. Although the first capacitance value and the second capacitance value differ depending on the temperature detection data DTD input to the processing circuit 60, the first capacitance value and the second capacitance value are capacitance values whose linearity is decreased as in the switching between CTD=7 and 8 in FIG. 8. In this case, the linearity of the capacitance value is improved by distributing the error in the capacitance value by the dithering.

In addition, in the present embodiment, the processing circuit 60 samples input capacitance control data ICL at a predetermined interval in the dithering. In a first period TA1 of the predetermined interval, the processing circuit 60 switches, in a time division manner, the input capacitance control data ICL between input capacitance control data ICL=0111 during the first period TA1 and data 1000 obtained by adding 1 LSB to the input capacitance control data ICL=0111 during the first period TA1. In a second period TA2 following the first period TA1, the processing circuit 60 switches, in a time division manner, the input capacitance control data ICL between input capacitance control data ICL=1000 during the second period TA2 and data 1001 obtained by adding 1 LSB to the input capacitance control data ICL=1000 during the second period TA2.

In the present embodiment, the temperature-compensated capacitance control data ICL output by the temperature compensation unit 63 corresponds to the input capacitance control data for the dithering. Although the input capacitance control data ICL during the first period TA1 and the input capacitance control data ICL during the second period TA2 are different in FIG. 9, the input capacitance control data ICL during the first period TA1 and the input capacitance control data ICL during the second period TA2 may be the same.

According to the present embodiment, since the input capacitance control data ICL is sampled at the predetermined interval, the input capacitance control data ICL does not change during the first period TA1, and the input capacitance control data ICL and data obtained by adding 1 LSB to the input capacitance control data ICL are output in a time division manner. The same applies to the second period TA2. Even when the linearity is decreased between a capacitance value corresponding to the ICL and a capacitance value corresponding to ICL+1 by performing such dithering, the linearity is improved by distributing, by the dithering, the error in the capacitance value that decreases the linearity.

In addition, in the present embodiment, the plurality of capacitors CC1 to CC11 of the capacitor array CPA1 include the first capacitor group LCG and the second capacitor group SCG. A plurality of MIM capacitors are coupled in parallel in the first capacitor group LCG, and the first capacitor group LCG corresponds to the high-order side bit CTD [10:3] of the capacitance control data CTD [10:0]. A plurality of MIM capacitors are coupled in series in the second capacitor group SCG, and the second capacitor group SCG corresponds to the low-order side bit CTD [2:0] of the capacitance control data CTD [10:0].

When the capacitor CC1 is constituted by one unit capacitor, a capacitor CC11 is constituted by 1024 unit capacitors.

Since a size of the unit capacitor is constrained by a design rule, a layout area of the capacitor array is increased. In this respect, a capacitance value smaller than the capacitance value of the unit capacitor can be generated by using the second capacitor group SCG in which the plurality of MIM capacitors are coupled in series. Accordingly, the layout area of the capacitor array can be reduced.

However, a parasitic capacitance is generated between ground and a node between the unit capacitors, but in the first capacitor group LCG and the second capacitor group SCG, the errors in the capacitance value are different since the methods of imparting the parasitic capacitance are different. Therefore, at a boundary between a range of capacitance control data CTD in which the first capacitor group LCG is used and a range of capacitance control data CTD in which the second capacitor group SCG is used, the linearity of the capacitance value of the variable capacitance circuit 31 tends to be remarkably decreased. In this respect, since the error in the capacitance value is distributed by the dithering, the linearity at the boundary as described above is improved.

In addition, in the present embodiment, the processing circuit 60 includes the temperature compensation unit 63 and the dithering unit 65. The temperature compensation unit 63 performs temperature compensation based on the temperature detection data DTD and outputs a result of the temperature compensation as the input capacitance control data ICL. The dithering unit 65 performs the dithering on the input capacitance control data ICL and outputs the dithered capacitance control data.

For example, in FIG. 9, the dithered capacitance control data is the capacitance control data CTD. Alternatively, as in the second detailed configuration example described later in FIG. 15, the capacitance control data CTD may be generated by further processing the dithered capacitance control data ICL'.

In temperature compensation, when the linearity of the capacitor array is decreased, a deviation of an oscillation frequency after the temperature compensation tends to be increased. According to the present embodiment, since the linearity of the capacitor array is improved by the dithering, the deviation of the oscillation frequency after the temperature compensation can be reduced.

2. First Detailed Configuration Example

Figure 11:
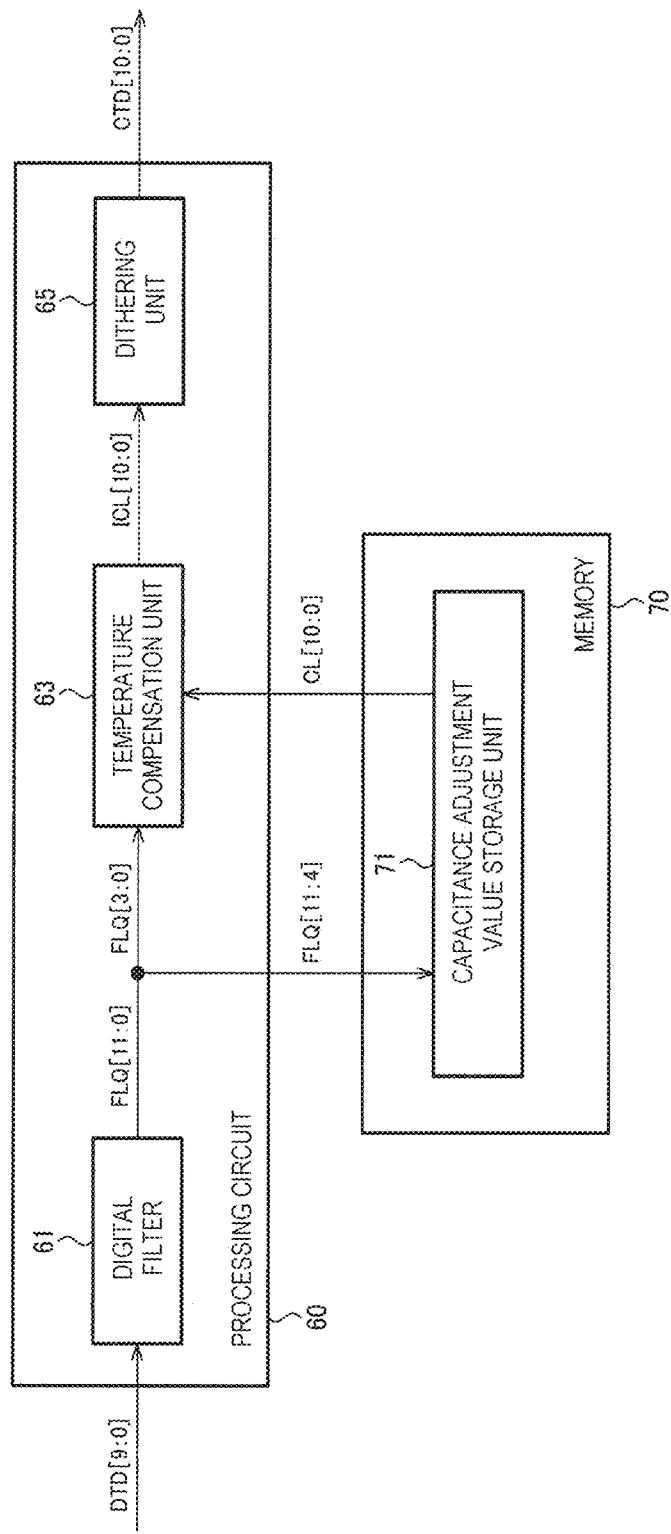
FIG. 11 shows a first detailed configuration example of the processing circuit and a memory.

FIG. 11 shows a first detailed configuration example of the processing circuit 60 and the memory 70. The processing circuit 60 includes a digital filter 61, the temperature compensation unit 63, and the dithering unit 65. The temperature compensation unit 63 is also called a linear interpolation unit. The memory 70 includes a capacitance adjustment value storage unit 71. The number of bits of each data shown in FIG. 11 is an example, and these numbers of bits may be optional.

The digital filter 61 performs digital filtering on temperature detection data DTD [9:0] input from the temperature sensor circuit 45, and outputs a result of the digital filtering as output data FLQ [11:0]. The digital filter 61 is, for example, an IIR filter, and the digital filtering is, for example, low-pass filtering. The IIR is an abbreviation for infinite impulse response.

The capacitance adjustment value storage unit 71 is a storage region designated by a predetermined address range in an address space in the memory 70, and stores a first table in which high-order 8-bit FLQ [11:4] of the output data FLQ [11:0] and a capacitance adjustment value CL [10:0] are associated with each other. The temperature compensation unit 63 reads, from the capacitance adjustment value storage unit 71, the capacitance adjustment value CL [10:0] corresponding to the high-order side bit FLQ [11:4] of the output data FLQ [11:0] input from the digital filter 61. The temperature compensation unit 63 linearly interpolates the read capacitance adjustment value CL [10:0] and outputs a result of the linear interpolation as temperature-compensated capacitance control data ICL [10:0].

Specifically, FLQ [11:4]=i is input to the capacitance adjustment value storage unit 71 when i is an integer of 0 or more and 255 or less. The capacitance adjustment value storage unit 71 outputs, to the temperature compensation unit 63, capacitance adjustment value CL [10:0]=CLi, CLi+1 corresponding to FLQ [11:4]=i, i+1 in the first table. CLi is called a first capacitance adjustment value, and CLi+1 is called a second capacitance adjustment value. The temperature compensation unit 63 interpolates between the first capacitance adjustment value CLi and the second capacitance adjustment value CLi+1 based on a low-order 4-bit FLQ [3:0] of the output data FLQ [11:0]. The interpolation is, for example, linear interpolation, and the temperature compensation unit 63 selects a value corresponding to the FLQ [3:0] from values obtained by dividing a difference between CLi and CLi+1 into 16.

The temperature-compensated capacitance control data ICL [10:0] is input as input capacitance control data to the dithering unit 65. The dithering unit 65 performs the dithering on the input capacitance control data ICL [10:0], and outputs the resulting dithered capacitance control data to the variable capacitance circuit 31 as the capacitance control data CTD [10:0]. An operation of the dithering unit 65 is as described in FIG. 9. That is, the dithering unit 65 outputs CTD [10:0]=ICL [10:0] and ICL [10:0]+1 in a time division manner. "+1" indicates that 1 is added to LSB of the ICL [10:0].

In the present embodiment described above, the processing circuit 60 outputs the dithered capacitance control data as the capacitance control data CTD to the variable capacitance circuit 31.

According to the present embodiment, the input capacitance control data and data obtained by adding 1 LSB to the input capacitance control data are output as the capacitance control data CTD to the variable capacitance circuit 31. Accordingly, the capacitance value of the variable capacitance circuit 31 is switched, in a time division manner, between a first capacitance value corresponding to the input capacitance control data and a second capacitance value corresponding to the data obtained by adding 1 LSB to the input capacitance control data. Accordingly, the linearity of the capacitance value is improved by distributing the error in the capacitance value as described above.

3. Second Detailed Configuration Example

Figure 12:
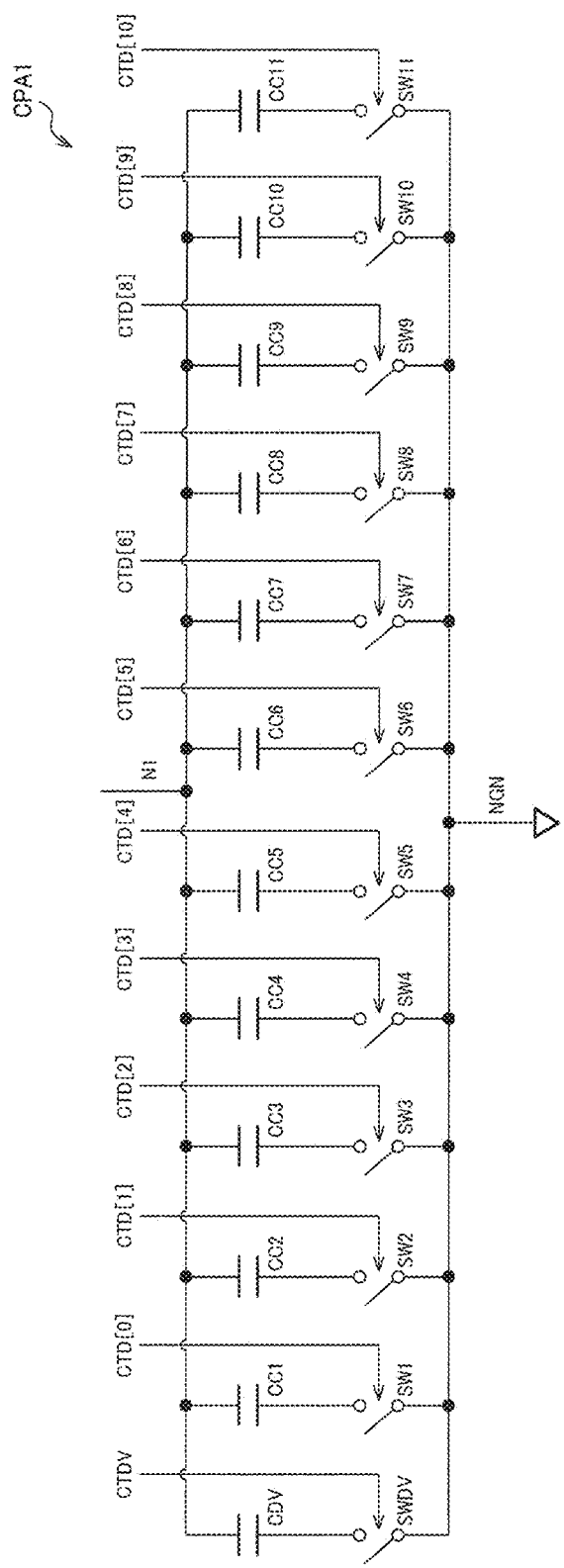
FIG. 12 shows a second detailed configuration example of the capacitor array.

FIG. 12 shows a second detailed configuration example of the capacitor array CPA1. The capacitor array CPA2 also has the same configuration. The capacitor array CPA1 includes the capacitors CC1 to CC11, the switches SW1 to SW11, a capacitor for switching CDV, and a switch for switching SWDV. Description of the same part as in FIG. 3 will be omitted.

One end of the capacitor for switching CDV is coupled to the input node N1 of the drive circuit 32, the other end of the capacitor for switching CDV is coupled to one end of the switch for switching SWDV, and the other end of the switch for switching SWDV is coupled to the ground node NGN. A configuration of the capacitor for switching CDV is the same as the configuration of the capacitor CC1 described in FIG. 4. In addition, a capacitance value of the capacitor for switching CDV is the same as the capacitance value of the capacitor CC1. The switch for switching SWDV is, for example, a transistor. The switch for switching SWDV is controlled to be turned on or off by using a switching control signal CTDV.

Figure 13:
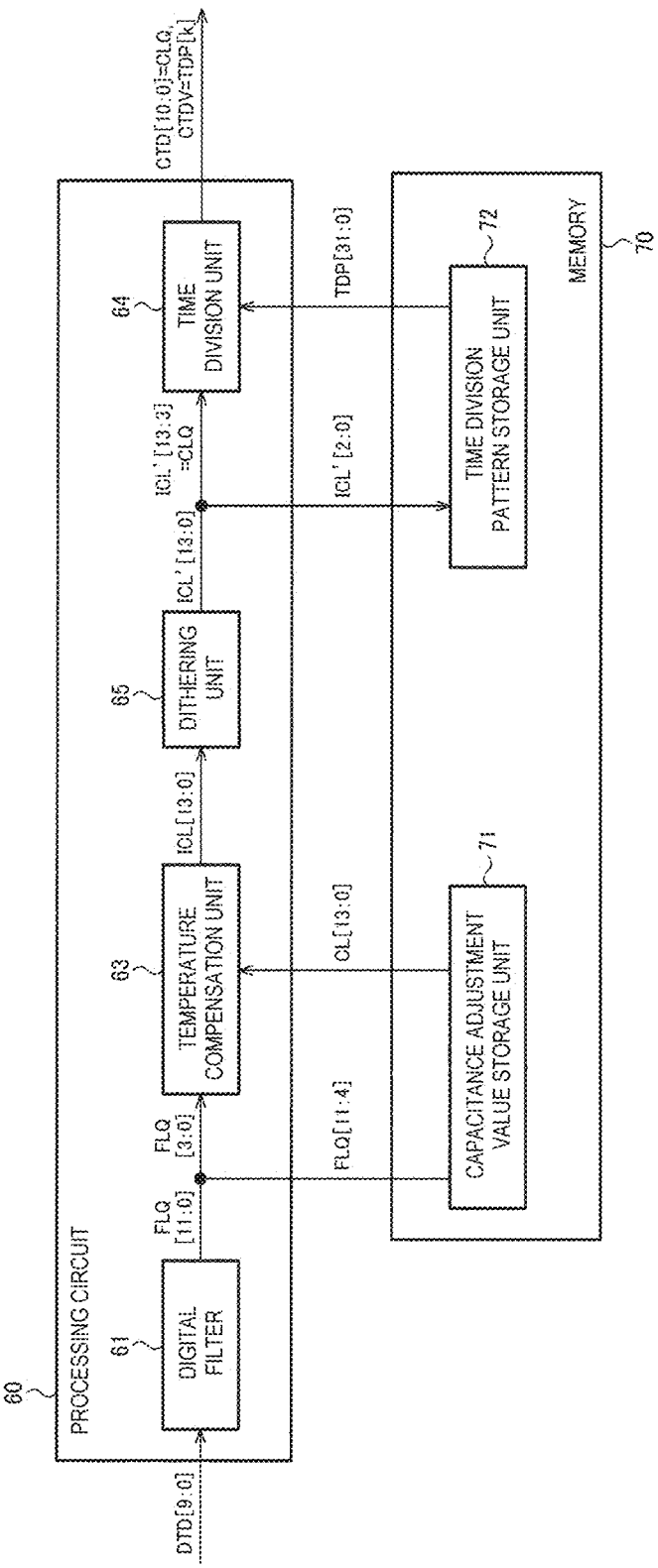
FIG. 13 shows a second detailed configuration example of the processing circuit and the memory.

FIG. 13 shows a second detailed configuration example of the processing circuit 60 and the memory 70. The processing circuit 60 includes the digital filter 61, the temperature compensation unit 63, the dithering unit 65, and a time division unit 64. The memory 70 includes the capacitance adjustment value storage unit 71 and a time division pattern storage unit 72. The number of bits of each data shown in FIG. 13 is an example, and these numbers of bits may be optional. Description of the same components as those described in FIG. 11 will be appropriately omitted.

The capacitance adjustment value storage unit 71 stores a first table in which high-order 8-bit FLQ [11:4] of the output data FLQ [11:0] and a capacitance adjustment value CL [13:0] are associated with each other. The temperature compensation unit 63 reads, from the capacitance adjustment value storage unit 71, the capacitance adjustment value CL [13:0] corresponding to the high-order side bit FLQ [11:4] of the output data FLQ [11:0] input from the digital filter 61. The temperature compensation unit 63 linearly interpolates the read capacitance adjustment value CL [13:0] and outputs a result of the linear interpolation as temperature-compensated capacitance control data ICL [13:0].

The dithering unit 65 performs the dithering on the temperature-compensated capacitance control data ICL [13:0] input from the temperature compensation unit 63, and outputs a result of the dithering as the dithered capacitance control data ICL' [13:0]. The dithering unit 65 outputs ICL' [13:0]=ICL [13:0] and ICL [13:0]+1 in a time division manner. "+1" indicates that 1 is added to LSB of the ICL [13:0].

The time division pattern storage unit 72 is a storage region designated by a predetermined address range in an address space in the memory 70, and stores a second table in which a low-order 3-bit ICL' [2:0] of the dithered capacitance control data ICL' [13:0] and time division pattern information TDP [31:0] are associated with each other. When j is an integer of 0 or more and 7 or less, ICL' [2:0]=j is input to the time division pattern storage unit 72. The time division pattern storage unit 72 outputs, to the time division unit 64, TDP [k]=TDP j corresponding to the ICL' [2:0]=j in the second table. The time division pattern information TDP [31:0] is information that indicates the time series when a first capacitance control data and a second capacitance control data are output.

When the capacitance value of the capacitor CC1, which is the minimum capacitance value of the capacitor array, is an integer "1", ICL' [13:3] indicates an integer part of the capacitance value, and ICL' [2:0] indicates a fractional part of the capacitance value. The fractional part is realized by the time division by using the time division unit 64.

The time division unit 64 outputs capacitance control data CTD [10:0]=CLQ and a switching control signal CTDV=TDP [k] based on high-order 11-bit ICL' [13:3] =CLQ of the dithered capacitance control data ICL' [13:0] and time division pattern information TDP j. k is an integer of 0 or more and 31 or less. The time division unit 64 controls the capacitance value of the variable capacitance circuit 31 in a time division manner by outputting CTDV=TDP [0], TDP [1], . . . , TDP [31] in a time division manner without changing CTD [10:0]=CLQ. CTD [10:0] =CLQ and CTDV=0 are called the first capacitance control data, and CTD [10:0]=CLQ and CTDV=1 are called the second capacitance control data. The time division unit 64 realizes the fractional part of the capacitance value as a time averaged value by outputting the first capacitance control data and the second capacitance control data in a time division manner based on the time division pattern information TDP j.

FIG. 14 shows an example of the second table stored in the time division pattern storage unit 72. In FIG. 14, ICL' [2:0] is expressed in a binary number. In addition, a logic level of each bit is indicated by 0 or 1 in the time division pattern information TDP [31:0].

When ICL' [2:0]=000h, a ratio of bits whose logic level is 1 in the TDP [31:0] is 0/8, so a corresponding fraction is 0.000. When ICL' [2:0]=001h, a ratio of bits whose logic level is 1 in the TDP [31:0] is 1/8, so a corresponding fraction is 0.125. Similarly, when ICL' [2:0]=010h, 011h, 100h, 101h, 110h, and 111h, ratios of bits whose logic level is 1 in the TDP [31:0] are 2/8, 3/8, 4/8, 5/8, 6/8, and 7/8, so corresponding fractions are 0.250, 0.375, 0.500, 0.625, 0.750, and 0.875.

By performing time division control by using such time division pattern information TDP [31:0], capacitance control data that substantially include a fractional part such as CLQ+0, CLQ+0.125, CLQ+0.250, . . . , CLQ+0.875 are realized.

Figure 15:
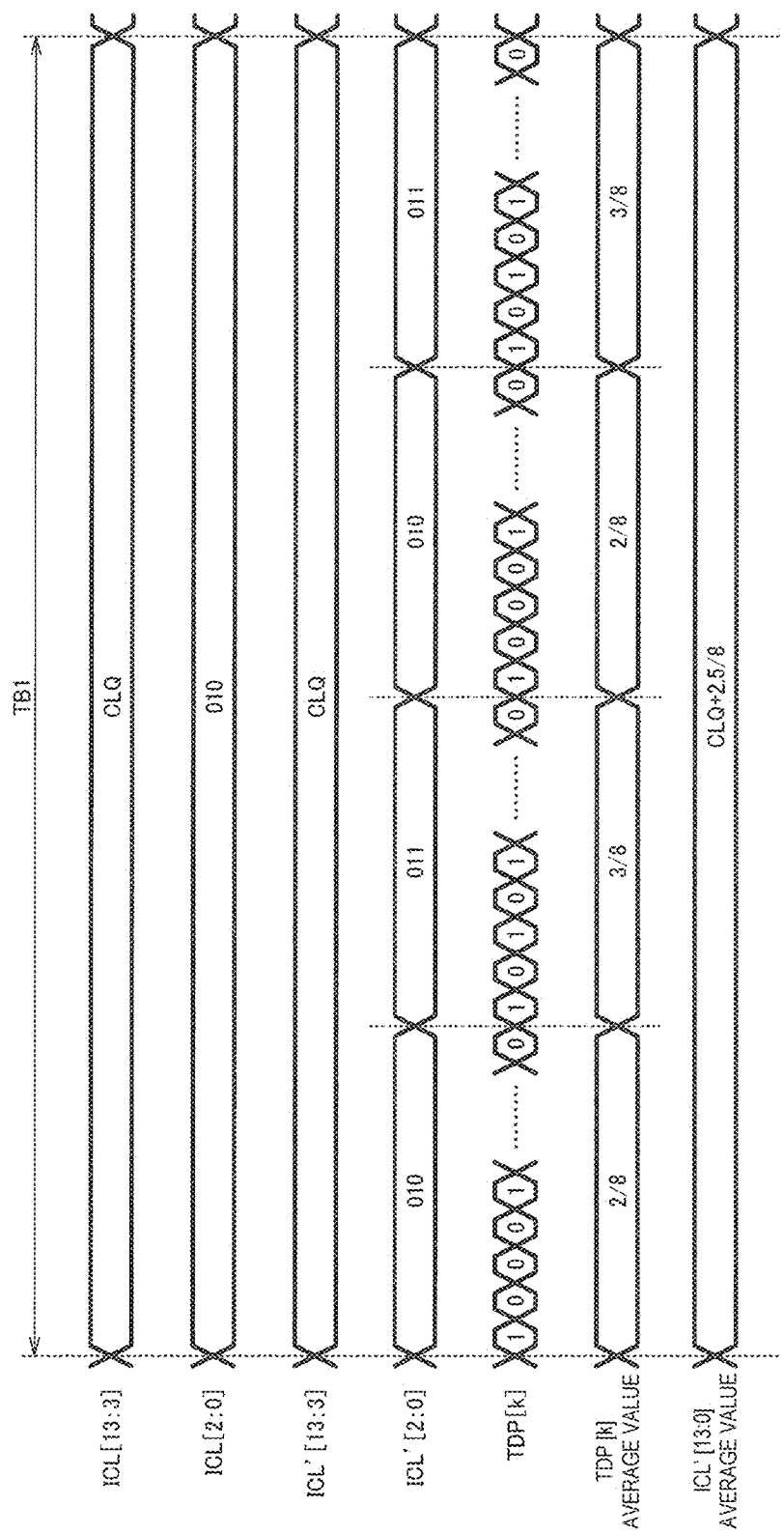
FIG. 15 is a timing chart illustrating an operation of the processing circuit in the second detailed configuration example.

FIG. 15 is a timing chart illustrating an operation of the processing circuit 60 in the second detailed configuration example. FIG. 15 shows one period TB1 among a plurality of periods repeated at a predetermined interval.

The temperature compensation unit 63 outputs ICL [13:3]=CLQ and ICL [2:0]=010 during the period TB1. The dithering unit 65 outputs ICL' [13:3]=CLQ and alternately outputs ICL' [2:0]=010 and 011 in a time division manner. The time division unit 64 outputs capacitance control data CTD [10:0]=ICL' [13:3]=CLQ. In addition, when ICL' [2:0]=010, the time division unit 64 outputs CTDV=TDP [k]=1, 0, 0, 0, 1, . . . , 0 in a time division manner based on the time division pattern information TDP [31:0] corresponding to ICL' [2:0]=010. When ICL' [2:0]=011, the time division unit 64 outputs CTDV=TDP [k]=1, 0, 1, 0, 1, . . . , 0 in a time division manner based on the time division pattern information TDP [31:0] corresponding to ICL' [2:0]=011.

When ICL' [2:0]=010, a time averaged value of the TDP [k] is 2/8, so the capacitance value of the variable capacitance circuit 31 in time average is CLQ+2/8. When ICL' [2:0]=011, a time averaged value of the TDP [k] is 3/8, so the capacitance value of the variable capacitance circuit in time average is CLQ+3/8. Since these capacitance values are alternately repeated by the dithering, a time-averaged capacitance value is CLQ+2.5/8 in the period TB1.

Figure 16:
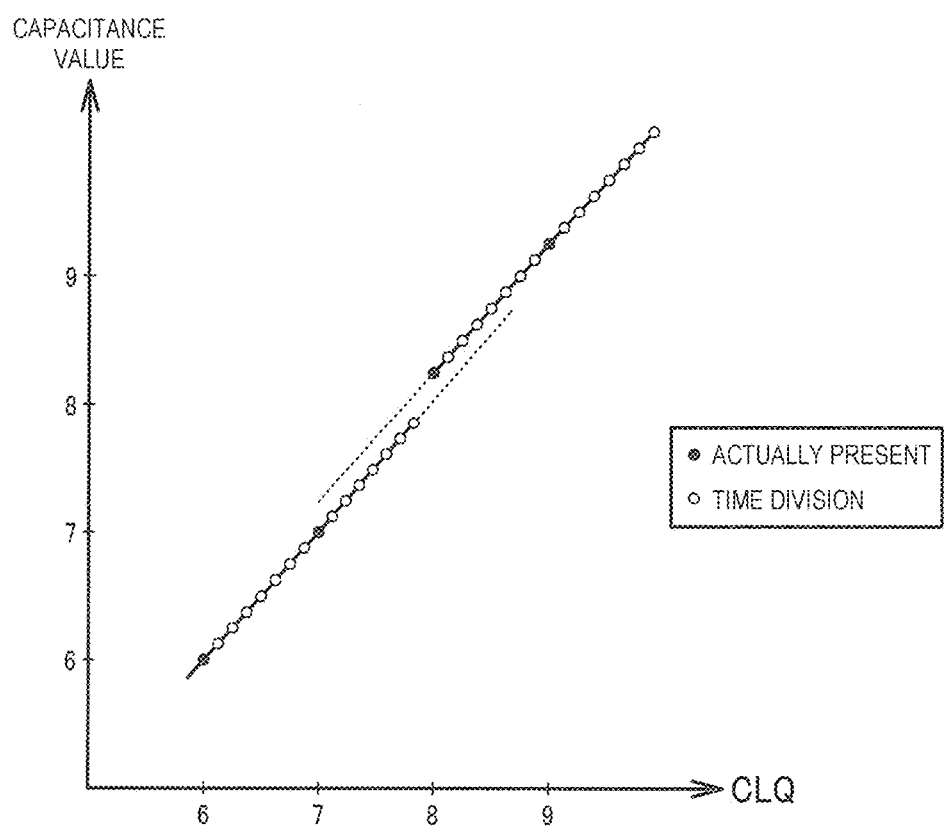
FIG. 16 shows a capacitance value of the variable capacitance circuit with respect to capacitance control data when the dithering unit does not perform the dithering.

FIG. 16 shows a capacitance value of the variable capacitance circuit 31 with respect to capacitance control data CTD=CLQ when the dithering unit 65 does not perform the dithering. A black circle indicates a capacitance value actually present in the capacitor array, that is, the integer part indicated by the CLQ. A white circle indicates the fractional part realized by the time division by using the time division unit 64.

Considering the integer part of the capacitance value, in the case of switching between CLQ=7 and 8, series coupling and parallel coupling of unit capacitors are switched, so the linearity of the capacitance value corresponding to CLQ=7 and the linearity of the capacitance value corresponding to CLQ=8 are decreased. When the fractional part of the capacitance value is included, the linearity of the capacitance value is decreased in the case of switching between CLQ=7+7/8 and CLQ=8+0/8. 7/8 and 0/8 indicate a fractional part realized by CTDV=TDP [k].

Figure 17:
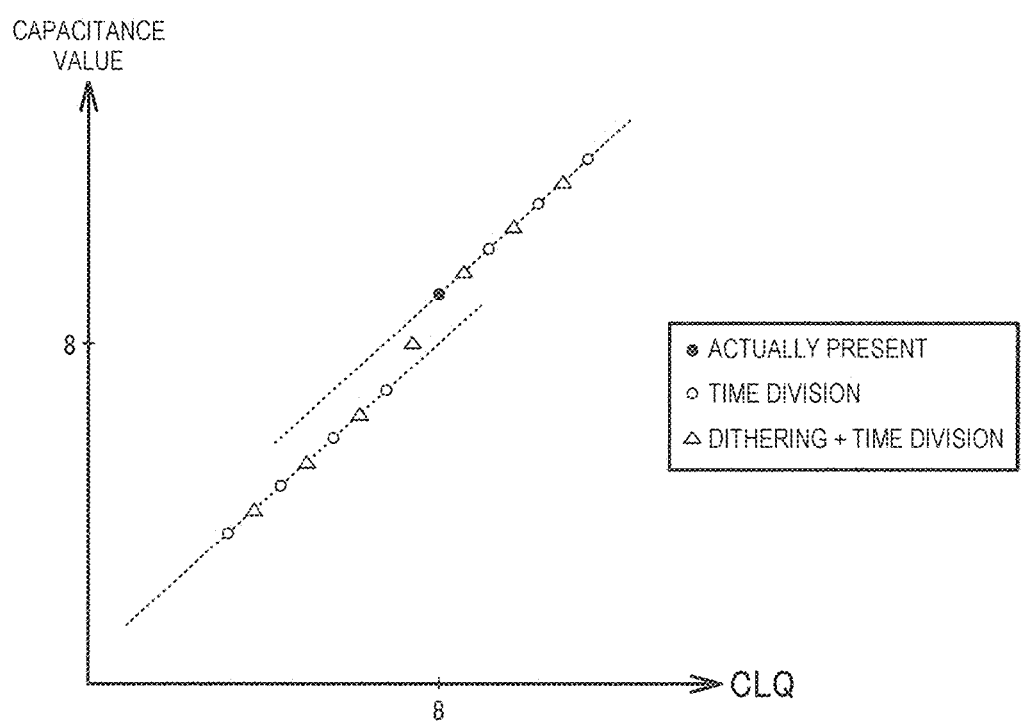
FIG. 17 shows a capacitance value of the variable capacitance circuit with respect to the capacitance control data when the dithering of the second detailed configuration example is applied.

FIG. 17 shows a capacitance value of the variable capacitance circuit 31 with respect to the capacitance control data CTD=CLQ when the dithering of the second detailed configuration example is applied. FIG. 17 shows an enlarged view of only a vicinity of CLQ=8. The black circle and the white circle are the same as in FIG. 16, and a triangle indicates a capacitance value when the dithering of the second detailed configuration example is applied.

When CLQ=7+7/8, CLQ=7+7/8 and CLQ=8+0/8 are alternately output by the dithering, so the capacitance value of the variable capacitance circuit 31 is a time averaged value of a capacitance value when CLQ=7+7/8 and a capacitance value when CLQ=8+0/8. In FIG. 17, the capacitance value of the variable capacitance circuit 31 is indicated by a triangular mark corresponding to CLQ=7+7.5/8. Although the error in the capacitance value is large in the case of switching between CLQ=7+7/8 and CLQ=8+0/8, the linearity of the capacitance value with respect to the CLQ is improved by distributing the error by the above-described dithering. By improving the linearity, the compensation accuracy of the temperature compensation of the oscillation frequency is improved, and the deviation of the oscillation frequency can be reduced.

In the present embodiment described above, the processing circuit 60 includes the time division unit 64 that performs the time division on the dithered capacitance control data ICL' [13:0]. The dithering unit 65 outputs, in a time division manner, first dithered capacitance control data ICL' [13:3]=CLQ and ICL' [2:0]=010 corresponding to the first capacitance value CLQ+2/8 and second dithered capacitance control data ICL' [13:3]=CLQ and ICL' [2:0]=011 corresponding to the second capacitance value CLQ+3/8. The time division unit 64 performs the time division based on the first dithered capacitance control data such that the capacitance value of the variable capacitance circuit 31 is the first capacitance value CLQ+2/8 as a time averaged value, and outputs capacitance control data CTD [10:0]=CLQ and CTDV=TDP [k]. The time division unit 64 performs the time division based on the second dithered capacitance control data such that the capacitance value of the variable capacitance circuit 31 is the second capacitance value CLQ+3/8 as a time averaged value, and outputs capacitance control data CTD [10:0]=CLQ and CTDV=TDP [k].

According to the present embodiment, by further performing the time division after the dithering, a capacitance value smaller than the minimum capacitance value of the capacitor array can be realized as a time averaged value in time division. The minimum capacitance value of the capacitor array is the capacitance value of the capacitor CC1, and when the minimum capacitance value of the capacitor array is an integer "1", the CLQ corresponds to the integer part, and 2/8 and 3/8 correspond to the fractional part. Accordingly, the compensation accuracy of the temperature compensation can be improved without increasing the number of capacitors in the capacitor array or the layout area of the capacitor array. By improving the compensation accuracy of the temperature compensation, the deviation of the oscillation frequency after the temperature compensation is reduced.

In addition, in the present embodiment, when the first dithered capacitance control data ICL' [13:3]=CLQ and ICL' [2:0]=010 are input, the time division unit 64 outputs to the variable capacitance circuit 31, in a time division manner, capacitance control data corresponding to a third capacitance value and capacitance control data corresponding to a fourth capacitance value such that the capacitance value of the variable capacitance circuit 31 is the first capacitance value CLQ+2/8 in time average. The third capacitance value is equal to or less than the first capacitance value CLQ+2/8, and the fourth capacitance value is larger than the first capacitance value CLQ+2/8.

In FIG. 15, the capacitance control data corresponding to the third capacitance value is CTD [10:0]=CLQ and CTDV=0, and the third capacitance value is a capacitance value corresponding to the CLQ. In addition, the capacitance control data corresponding to the fourth capacitance value is CTD [10:0]=CLQ and CTDV=1, and the fourth capacitance value is a capacitance value corresponding to CLQ+1. Time division is performed based on CTDV=TDP [k]=1, 0, 0, 0, 1, . . . , 0, and the first capacitance value CLQ+2/8 is realized as a time averaged value.

In addition, when the second dithered capacitance control data ICL' [13:3]=CLQ and ICL' [2:0]=011 are input, the time division unit 64 outputs to the variable capacitance circuit 31, in a time division manner, capacitance control data corresponding to a fifth capacitance value and capacitance control data corresponding to a sixth capacitance value such that the capacitance value of the variable capacitance circuit 31 is the second capacitance value CLQ+3/8 in time average. The fifth capacitance value is equal to or less than the second capacitance value CLQ+3/8, and the sixth capacitance value is larger than the second capacitance value CLQ+3/8.

In FIG. 15, the capacitance control data corresponding to the fifth capacitance value is CTD [10:0]=CLQ and CTDV=0, and the fifth capacitance value is a capacitance value corresponding to the CLQ. In addition, the capacitance control data corresponding to the sixth capacitance value is CTD [10:0]=CLQ and CTDV=1, and the sixth capacitance value is a capacitance value corresponding to CLQ+1. Time division is performed based on CTDV=TDP [k]=1, 0, 1, 0, 1, . . . , 0, and the second capacitance value CLQ+3/8 is realized as a time averaged value.

According to the present embodiment, the capacitance value of the variable capacitance circuit 31 is switched between the first capacitance value CLQ+2/8 and the second capacitance value CLQ+3/8 by the dithering. In this case, each of 2/8 and 3/8, which are the fractional parts of the capacitance value, is realized by time division. Accordingly, the capacitance value smaller than the minimum capacitance value of the capacitor array can be used, and the linearity of the capacitance value can be improved by the dithering.

In addition, in the present embodiment, the capacitor array CPA1 includes the capacitor for switching CDV and the switch for switching SWDV. The capacitor for switching CDV has the capacitance value same as that of the capacitor CC1 having the minimum capacitance value among the plurality of capacitors CC1 to CC11 each having a binary-weighted capacitance value. The switch for switching SWDV is provided in series with the capacitor for switching CDV and between the oscillation node and the ground node NGN. The switch for switching SWDV is turned off when the capacitance control data corresponding to the third capacitance value is input, and is turned on when the capacitance control data corresponding to the fourth capacitance value is input. In addition, the switch for switching SWDV is turned off when the capacitance control data corresponding to the fifth capacitance value is input, and is turned on when the capacitance control data corresponding to the sixth capacitance value is input.

According to the present embodiment, when the switch for switching SWDV is turned on or off in a time division manner, the capacitance value of the variable capacitance circuit 31 changes in a time division manner by the capacitance value of the capacitor for switching CDV. Since the capacitance value of the capacitor for switching CDV is the same as that of the capacitor CC1 having the minimum capacitance value in the capacitor array, the capacitance value smaller than the minimum capacitance value is realized as a time averaged value in time division.

A circuit device of the present embodiment described above includes an oscillation circuit and a processing circuit that generates capacitance control data. The oscillation circuit includes a variable capacitance circuit whose capacitance value is variably controlled based on the capacitance control data, and an oscillation frequency thereof is controlled based on the capacitance value of the variable capacitance circuit. The variable capacitance circuit includes a capacitor array. The capacitor array includes a plurality of capacitors each having a binary-weighted capacitance value, and a plurality of switches that are provided in series with the plurality of capacitors between an oscillation node and a ground node of the oscillation circuit, and are on-off controlled based on the capacitance control data. The processing circuit outputs the capacitance control data, which is subjected to dithering, so as to switch the capacitance value of the variable capacitance circuit between a first capacitance value and a second capacitance value in a time division manner.

According to the present embodiment, by performing the dithering to switch the capacitance value of the variable capacitance circuit between the first capacitance value and the second capacitance value in a time division manner, the capacitance value of the variable capacitance circuit is an average value of the first capacitance value and the second capacitance value in time average. Accordingly, the linearity of the capacitance value of the variable capacitance circuit with respect to the capacitance control data is improved. That is, since an error in the first capacitance value and an error in the second capacitance value are temporally distributed by the dithering, the linearity of the capacitance value is improved when seen as a capacitance value in time average.

In addition, in the present embodiment, the processing circuit may sample input capacitance control data at a predetermined interval in the dithering. In a first period of the predetermined interval, the processing circuit may switch, in a time division manner, the input capacitance control data between the input capacitance control data during the first period and data obtained by adding 1 LSB to the input capacitance control data during the first period. In a second period following the first period, the processing circuit may switch, in a time division manner, the input capacitance control data between the input capacitance control data during the second period and data obtained by adding 1 LSB to the input capacitance control data during the second period.

According to the present embodiment, since the input capacitance control data is sampled at the predetermined interval, the input capacitance control data does not change during the first period, and the input capacitance control data and the data obtained by adding 1 LSB to the input capacitance control data are output in a time division manner. The same applies to the second period. Even when the linearity is decreased between a capacitance value corresponding to the input capacitance control data and a capacitance value corresponding to the data obtained by adding 1 LSB to the input capacitance control data, the linearity is improved by performing the dithering as described above.

In addition, in the present embodiment, the plurality of capacitors of the capacitor array may include a first capacitor group and a second capacitor group. In the first capacitor group, a plurality of MIM capacitors may be coupled in parallel, and the first capacitor group may correspond to a high-order side bit of the capacitance control data. In the second capacitor group, a plurality of MIM capacitors may be coupled in series, and the second capacitor group may correspond to a low-order side bit of the capacitance control data.

In the first capacitor group and the second capacitor group, errors in the capacitance value are different since methods of imparting a parasitic capacitance are different. Therefore, at a boundary between a range of capacitance control data in which the first capacitor group is used and a range of capacitance control data in which the second capacitor group is used, the linearity of the capacitance value of the variable capacitance circuit tends to be remarkably decreased. In this respect, in the present embodiment, since the error in the capacitance value is distributed by the dithering, the linearity at the boundary as described above is improved.

In addition, in the present embodiment, the processing circuit may include a temperature compensation unit and a dithering unit. The temperature compensation unit may perform temperature compensation based on temperature detection data and output, as the input capacitance control data, a result of the temperature compensation. The dithering unit may perform the dithering on the input capacitance control data and output dithered capacitance control data.

In temperature compensation, when the linearity of the capacitor array is decreased, a deviation of an oscillation frequency after the temperature compensation tends to be increased. According to the present embodiment, since the linearity of the capacitor array is improved by the dithering, the deviation of the oscillation frequency after the temperature compensation can be reduced.

In addition, in the present embodiment, the processing circuit may output, as the capacitance control data, the dithered capacitance control data to the variable capacitance circuit.

According to the present embodiment, the input capacitance control data and the data obtained by adding 1 LSB to the input capacitance control data are output as the capacitance control data to the variable capacitance circuit. Accordingly, the capacitance value of the variable capacitance circuit is switched, in a time division manner, between a first capacitance value corresponding to the input capacitance control data and a second capacitance value corresponding to the data obtained by adding 1 LSB to the input capacitance control data. Accordingly, the linearity of the capacitance value is improved by distributing the error in the capacitance value as described above.

In addition, in the present embodiment, the processing circuit may include a time division unit that performs time division on the dithered capacitance control data. The dithering unit may output, in a time division manner, first dithered capacitance control data corresponding to the first capacitance value and second dithered capacitance control data corresponding to the second capacitance value. The time division unit may perform the time division based on the first dithered capacitance control data such that the capacitance value of the variable capacitance circuit is the first capacitance value as a time averaged value, and output the capacitance control data. The time division unit may perform the time division based on the second dithered capacitance control data such that the capacitance value of the variable capacitance circuit is the second capacitance value as a time averaged value, and output the capacitance control data.

According to the present embodiment, by further performing the time division after the dithering, a capacitance value smaller than the minimum capacitance value of the capacitor array is realized as a time averaged value in time division. Accordingly, the compensation accuracy of the temperature compensation can be improved without increasing the number of capacitors in the capacitor array or the layout area of the capacitor array. By improving the compensation accuracy of the temperature compensation, the deviation of the oscillation frequency after the temperature compensation is reduced.

In addition, in the present embodiment, the time division unit may output to the variable capacitance circuit, in a time division manner, the capacitance control data corresponding to a third capacitance value equal to or less than the first capacitance value and the capacitance control data corresponding to a fourth capacitance value larger than the first capacitance value such that the capacitance value of the variable capacitance circuit is the first capacitance value in time average when the first dithered capacitance control data is input. The time division unit may output to the variable capacitance circuit, in a time division manner, the capacitance control data corresponding to a fifth capacitance value equal to or less than the second capacitance value and the capacitance control data corresponding to a sixth capacitance value larger than the second capacitance value such that the capacitance value of the variable capacitance circuit is the second capacitance value in time average when the second dithered capacitance control data is input.

According to the present embodiment, the capacitance value of the variable capacitance circuit is switched between the first capacitance value and the second capacitance value by the dithering. In this case, each of a fractional part of the first capacitance value and a fractional part of the second capacitance value is realized by the time division. Accordingly, the capacitance value smaller than the minimum capacitance value of the capacitor array can be realized, and the linearity of the capacitance value can be improved by the dithering.

In addition, in the present embodiment, the capacitor array may include a capacitor for switching having a capacitance value same as that of a capacitor having a minimum capacitance value among the plurality of capacitors each having a binary-weighted capacitance value, and a switch for switching provided in series with the capacitor for switching and between the oscillation node and the ground node. The switch for switching may be turned off when the capacitance control data corresponding to the third capacitance value is input, and may be turned on when the capacitance control data corresponding to the fourth capacitance value is input. The switch for switching may be turned off when the capacitance control data corresponding to the fifth capacitance value is input, and may be turned on when the capacitance control data corresponding to the sixth capacitance value is input.

According to the present embodiment, when the switch for switching is turned on or off in a time division manner, the capacitance value of the variable capacitance circuit changes in a time division manner by the capacitance value of the capacitor for switching. Since the capacitance value of the capacitor for switching is the same as that of the capacitor having the minimum capacitance value in the capacitor array, the capacitance value smaller than the minimum capacitance value will be realized as a time averaged value in time division.

Further, an oscillator of the present embodiment includes the above-described circuit device, and a resonator that oscillates by being driven by the oscillation circuit.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. Further, the configurations and operations of the circuit device, the resonator, and the oscillator are not limited to those described in the present embodiment, and various modifications can be made.

What is claimed is:

1. A circuit device comprising:
   a processing circuit that generates capacitance control data; and
   an oscillation circuit that includes a variable capacitance circuit whose capacitance value is variably controlled based on the capacitance control data, and whose oscillation frequency is controlled based on the capacitance value of the variable capacitance circuit, wherein
   the variable capacitance circuit includes a capacitor array,
   the capacitor array includes
      a plurality of capacitors each having a binary-weighted capacitance value, and
      a plurality of switches that are provided in series with the plurality of capacitors between an oscillation node and a ground node of the oscillation circuit and that are on-off controlled based on the capacitance control data, and
   the processing circuit outputs the capacitance control data, which is subjected to dithering, so as to switch the capacitance value of the variable capacitance circuit between a first capacitance value and a second capacitance value in a time division manner, wherein
   in the dithering, the processing circuit
      samples input capacitance control data at a predetermined interval,
      in a first period of the predetermined interval, switches, in a time division manner, the input capacitance control data between the input capacitance control data during the first period and data obtained by adding 1 LSB to the input capacitance control data during the first period, and
      in a second period following the first period, switches, in a time division manner, the input capacitance control data between the input capacitance control data during the second period and data obtained by adding 1 LSB to the input capacitance control data during the second period.

2. The circuit device according to claim 1, wherein
   the plurality of capacitors of the capacitor array include
      a first capacitor group in which a plurality of MIM capacitors are coupled in parallel and that corresponds to a high-order side bit of the capacitance control data, and
      a second capacitor group in which a plurality of MIM capacitors are coupled in series and that corresponds to a low-order side bit of the capacitance control data.

3. The circuit device according to claim 1, wherein
   the processing circuit includes
      a temperature compensation unit that performs temperature compensation based on temperature detection data and outputs, as the input capacitance control data, a result of the temperature compensation, and
      a dithering unit that performs the dithering on the input capacitance control data and outputs dithered capacitance control data.

4. The circuit device according to claim 3, wherein
   the processing circuit outputs, as the capacitance control data, the dithered capacitance control data to the variable capacitance circuit.

5. The circuit device according to claim 3, wherein
   the processing circuit includes a time division unit that performs time division on the dithered capacitance control data,
   the dithering unit outputs, in a time division manner, first dithered capacitance control data corresponding to the first capacitance value and second dithered capacitance control data corresponding to the second capacitance value, and
   the time division unit
      performs the time division based on the first dithered capacitance control data such that the capacitance value of the variable capacitance circuit is the first capacitance value as a time averaged value, and outputs the capacitance control data, and
      performs the time division based on the second dithered capacitance control data such that the capacitance value of the variable capacitance circuit is the second capacitance value as a time averaged value, and outputs the capacitance control data.

6. The circuit device according to claim 5, wherein
   the time division unit
      outputs to the variable capacitance circuit, in a time division manner, the capacitance control data corresponding to a third capacitance value equal to or less than the first capacitance value and the capacitance control data corresponding to a fourth capacitance value larger than the first capacitance value such that the capacitance value of the variable capacitance circuit is the first capacitance value in time average when the first dithered capacitance control data is input, and
      outputs to the variable capacitance circuit, in a time division manner, the capacitance control data corresponding to a fifth capacitance value equal to or less than the second capacitance value and the capacitance control data corresponding to a sixth capacitance value larger than the second capacitance value such that the capacitance value of the variable capacitance circuit is the second capacitance value in time average when the second dithered capacitance control data is input.

7. The circuit device according to claim 6, wherein
   the capacitor array includes
      a capacitor for switching having a capacitance value same as that of a capacitor having a minimum capacitance value among the plurality of capacitors each having a binary-weighted capacitance value, and a switch for switching provided in series with the capacitor for switching and between the oscillation node and the ground node, and the switch for switching
is turned off when the capacitance control data corresponding to the third capacitance value is input, and is turned on when the capacitance control data corresponding to the fourth capacitance value is input, and is turned off when the capacitance control data corresponding to the fifth capacitance value is input, and is turned on when the capacitance control data corresponding to the sixth capacitance value is input.

8. An oscillator comprising:
the circuit device according to claim 1; and
a resonator that oscillates by being driven by the oscillation circuit.

* * * * *